(12) United States Patent
Chiu et al.

(10) Patent No.: US 7,763,479 B2
(45) Date of Patent: *Jul. 27, 2010

(54) PIXEL STRUCTURE AND METHOD OF FABRICATING THE SAME

(75) Inventors: Ta-Wei Chiu, Hsin-Chu (TW); Yi-Sheng Cheng, Hsin-Chu (TW); Shih-Yi Yen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 46 days.

This patent is subject to a terminal disclaimer.

(21) Appl. No.: 12/017,338

(22) Filed: Jan. 22, 2008

(65) Prior Publication Data

US 2009/0026449 A1    Jan. 29, 2009

(30) Foreign Application Priority Data

Jul. 25, 2007    (TW) .............................. 96127138 A

(51) Int. Cl.
  *H01L 21/00* (2006.01)
  *H01L 29/06* (2006.01)
(52) U.S. Cl. .............................. 438/29; 438/24; 257/59; 257/E21.535; 257/E21.002
(58) Field of Classification Search .......... 257/E21.002, 257/E21.535; 438/29
  See application file for complete search history.

(56) References Cited

U.S. PATENT DOCUMENTS

| | | | |
|---|---|---|---|
| 6,403,409 B1 * | 6/2002 | You | 438/164 |
| 6,493,046 B1 | 12/2002 | Ueda | |
| 6,734,034 B2 | 5/2004 | Shih | |
| 6,909,114 B1 | 6/2005 | Yamazaki | |
| 6,939,750 B2 | 9/2005 | Hotta et al. | |
| 7,064,021 B2 | 6/2006 | Chang | |
| 2002/0052058 A1 * | 5/2002 | Tseng | 438/30 |
| 2004/0152223 A1 * | 8/2004 | Tachikawa et al. | 438/29 |
| 2004/0206956 A1 | 10/2004 | Yanai et al. | |
| 2006/0131581 A1 * | 6/2006 | Kim et al. | 257/59 |
| 2007/0291193 A1 * | 12/2007 | Cheng | 349/43 |
| 2008/0283841 A1 * | 11/2008 | Yamayoshi | 257/71 |
| 2009/0057666 A1 * | 3/2009 | Shih et al. | 257/59 |

FOREIGN PATENT DOCUMENTS

CN    1877432 A    12/2006

* cited by examiner

*Primary Examiner*—Wael Fahmy
*Assistant Examiner*—Sarah K Salerno
(74) *Attorney, Agent, or Firm*—Winston Hsu

(57) ABSTRACT

A method for fabricating pixel structures is disclosed. Specifically, the present invention deposits a conductive layer, a gate dielectric layer, and an aluminum layer on a gate dielectric layer, and performs an isotropic etching process to evenly etch a portion of the aluminum layer in the horizontal and vertical direction. By following this process, the number of photomasks used before the formation of the source/drain region can be reduced, and the conductive layer and the aluminum layer disposed on the capacitor electrode in the capacitor region can be used to increase the capacitance of the capacitor.

15 Claims, 15 Drawing Sheets

PIXEL STRUCTURE AND METHOD OF FABRICATING THE SAME

BACKGROUND OF THE INVENTION

1. Field of the Invention

The invention relates a pixel structure and a method of fabricating the pixel structure.

2. Description of the Prior Art

A liquid crystal display (LCD) has gradually replaced a conventional cathode ray tube (CRT) display due to its small size, low radiation, and low power consumption. Generally speaking, an LCD panel includes an array substrate having thin film transistors thereon, a color filter substrate, and a liquid crystal layer disposed between the array substrate and the color filter substrate. The array substrate includes a plurality of pixel regions defined by a plurality of scan lines arranged in parallel, and a plurality of data lines arranged in parallel and perpendicular to the scan lines. Each pixel region is controlled by a thin film transistor as switch element and a pixel electrode to drive liquid crystal molecules to rotate in different extents for adjusting brightness outputs. The color filter disposed on the color filter substrate includes a plurality of red color filters, green color filters, and blue color filters corresponding to each pixel region so that the LCD panel can output high quality images with different colors.

Referring to FIGS. 1-6, FIGS. 1-6 illustrate a method for fabricating a pixel structure according to the prior art. As shown in FIG. 1, a substrate 12 having at least a transistor region 14 and a capacitor region 16 is provided. A patterned polysilicon layer 18 is then formed on the transistor region 14 and the capacitor region 16 of the substrate 12, in which the pattern polysilicon layer 18 disposed in the transistor region 14 is used for forming a source/drain region of the transistor and the patterned polysilicon layer 18 disposed in the capacitor region 16 is used for forming a bottom electrode of a capacitor. The process for forming the patterned polysilicon layer 18 can be accomplished with a standard process for fabricating low temperature polysilicon layers. For instance, an amorphous silicon layer (not shown) can be formed on the surface of the substrate 12, and an excimer laser annealing process is conducted to transform the amorphous silicon layer into a polysilicon layer. Next, a patterning process is performed to remove a portion of the polysilicon layer and form the patterned polysilicon layer 18 on the substrate 12.

Next, as shown in FIG. 2, a gate dielectric layer 20 composed of silicon oxide is formed on the substrate 12 to cover the patterned polysilicon layer 18. A patterned photoresist layer 22 is then formed on the gate dielectric layer 20 and an ion implantation is conducted by using the patterned photoresist layer 22 as mask to inject p-type or n-type dopants into the patterned polysilicon layer 18. The result forms a source/drain region 24 in the patterned polysilicon layer 18 of the transistor region 14.

As shown in FIG. 3, a conductive layer (not shown) composed of molybdenum is formed on the gate dielectric layer 20, and a patterning process is performed to remove a portion of the conductive layer for forming a gate 26 on the gate dielectric layer 20 of the transistor region and an upper capacitor electrode 28 on the gate dielectric layer 20 of the capacitor region 16. An ion implantation is then conducted by using the gate 26 as mask to inject p-type or n-type dopants into the patterned polysilicon layer 18. The result forms a lightly doped drain 30 in the patterned polysilicon layer 18 and completes the fabrication of a transistor in the transistor region 14 and a capacitor in the capacitor region 16.

Next, as shown in FIG. 4, a dielectric layer 32 is deposited on the gate dielectric layer 20, the gate 26, and the upper capacitor electrode 28, and a patterning process is performed to form a plurality of via holes 34 in the dielectric layer 32 and the gate dielectric layer 20.

As shown in FIG. 5, a patterned metal layer is formed on the dielectric layer and into each of the via holes 34, thereby forming a plurality of wires 36 connecting to the source/drain region 24.

As shown in FIG. 6, another dielectric layer 38 serving as a planarizing layer is formed on the wires 36, and a patterning process is performed by using a patterned photoresist layer (not shown) as a mask to conduct an etching process to form at least an opening 40 in the dielectric layer 38. Next, a patterned transparent conductive layer is formed on the dielectric layer 38 and into the opening 40 to form a corresponding pixel electrode 42. This completes the fabrication of a typical pixel structure.

It should be noted that the aforementioned process typically takes at least seven photomasks to complete the entire process for fabricating a pixel structure, which increases the overall cost of the fabrication significantly. Additionally, the capacitor fabricated along the transistor is typically composed of a polysilicon layer, a dielectric layer composed of silicon oxide, and a conductive layer composed of molybdenum. Despite the capacitor having such structure may qualify the demand for typical pixel structures, the capacity of these capacitors is still insufficient under many circumstances. Hence, finding a way to reduce the overall fabrication cost while increasing the capacity for the capacitor has become an important task.

SUMMARY OF THE INVENTION

It is an objective of the present invention to provide a method for fabricating pixel structures.

A method for fabricating pixel structures is disclosed. The method includes the following steps: providing a substrate having a transistor region and a capacitor region; forming a patterned semiconductor layer on the transistor region and the capacitor region of the substrate; forming a gate dielectric layer on the patterned semiconductor layer; forming a conductive layer, a dielectric layer, and an electrode layer on the substrate; forming a plurality of patterned photoresist layer on the electrode layer of the transistor region and the capacitor region; performing an isotropic etching process by using the patterned photoresist layer as mask to remove a portion of the electrode layer in both vertical and horizontal direction; performing a first etching process by using the patterned photoresist layer as a mask to remove a portion of the dielectric layer and the conductive layer; performing a first ion implantation process by using the patterned photoresist layer as mask to form a source/drain region in the patterned semiconductor layer; removing the patterned photoresist layer of the transistor region; performing a second etching process by using the electrode layer as mask to remove a portion of the dielectric layer and the conductive layer; performing a second ion implantation process by using the patterned photoresist layer as mask to form a lightly doped drain in the patterned semiconductor layer; performing a third etching process by using the patterned photoresist layer of the capacitor region as mask to remove the electrode layer disposed in the transistor region; removing the patterned photoresist layer disposed in the capacitor region; forming a first dielectric layer on the substrate and forming a plurality of first via holes in the first dielectric layer; forming a patterned metal layer on the first dielectric layer and into the first via holes for forming a plurality of first wires; forming a second dielectric layer on the first wires and forming a plurality of first openings in the second dielectric layer; and forming a patterned transparent conductive layer on the second dielectric layer and into the first openings for forming a plurality of pixel electrodes.

Specifically, the present invention discloses a method for fabricating pixel structures, in which a conductive layer composed of molybdenum, a dielectric layer composed of silicon oxide and an aluminum layer are deposited on a gate dielectric layer, and an isotropic etching process is performed to evenly remove a portion of the aluminum layer in both horizontal and vertical direction. Typically, the etchant utilized to etch aluminum material has the characteristic of achieving an isotropic etching process. Hence, when the aluminum layer is etched, not only the bottom portion of the aluminum layer is removed, the sidewall of the aluminum layer is also removed simultaneously to expose a required length for the lightly doped drain formed afterwards. In other words, the present invention could reduce the number of masks required to form the source/drain region from three to two, thereby reducing the overall cost of the fabrication process. According to an embodiment of the present invention, a stacked structure composed of silicon oxide and aluminum can also be formed on the capacitor electrode (such as the conductive layer composed of molybdenum) to increase the storage capacitance of the capacitor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
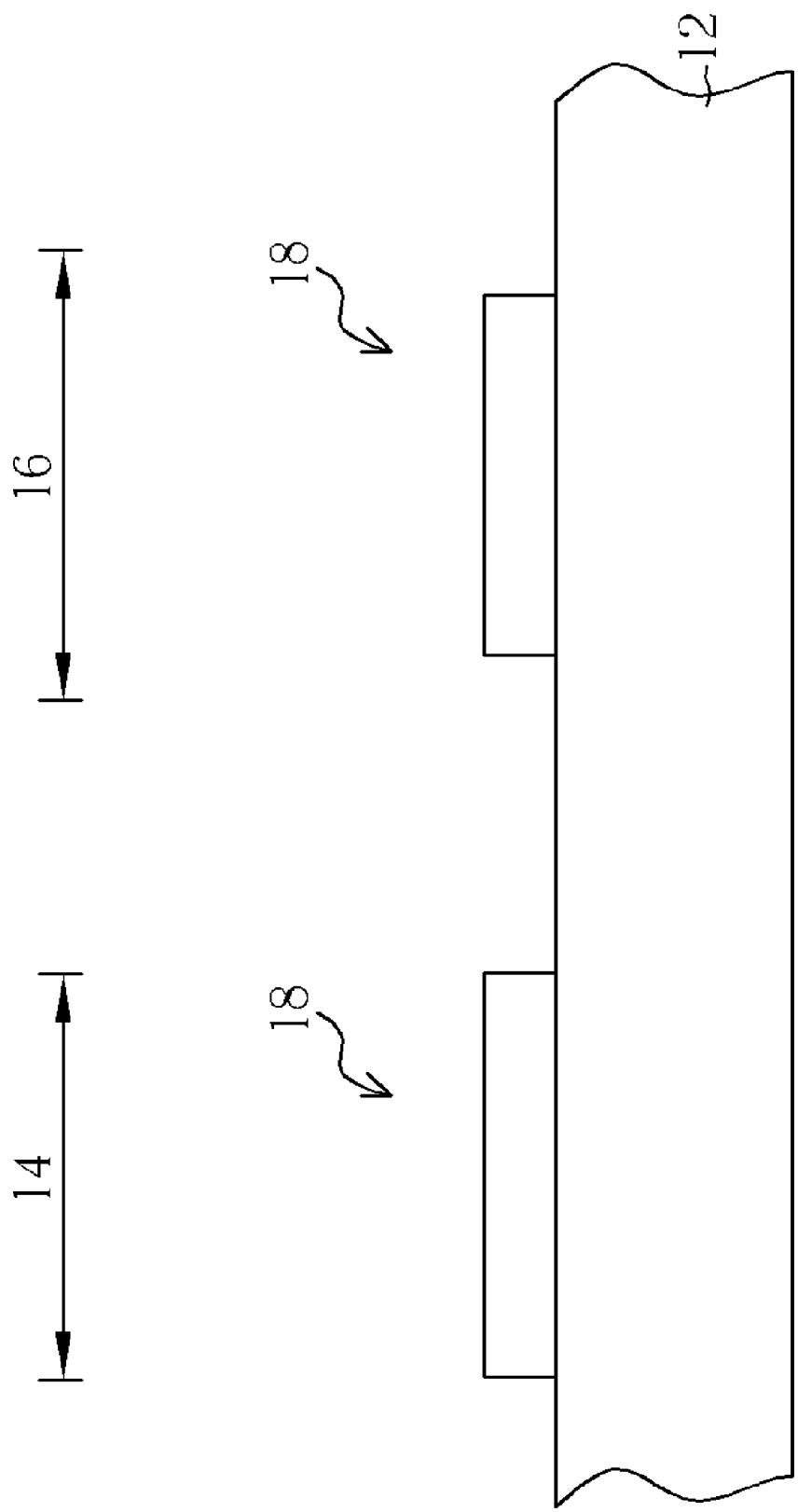
FIGS. 1-6 illustrate a method for fabricating a pixel structure according to the prior art.
Figure 2:
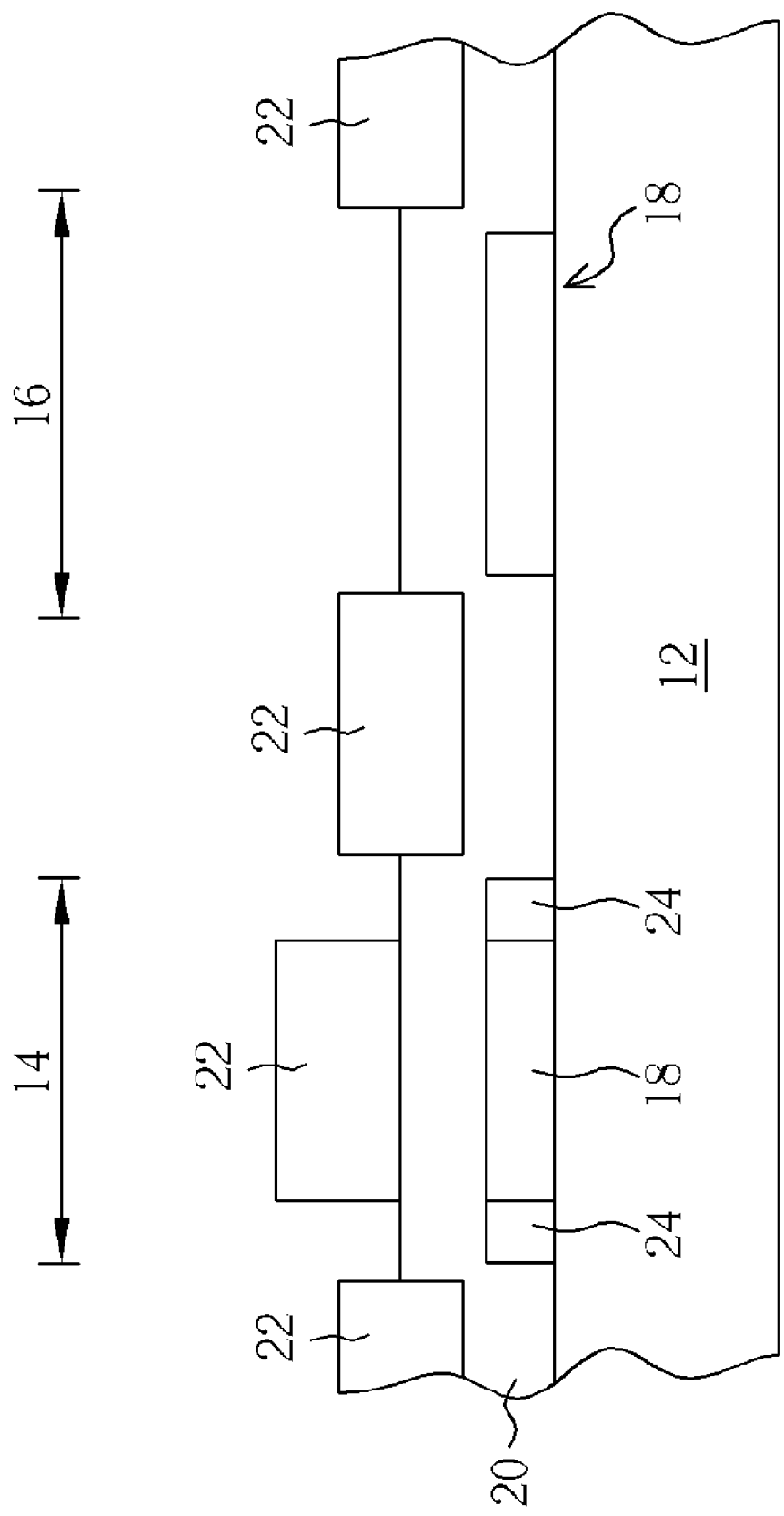
Figure 3:
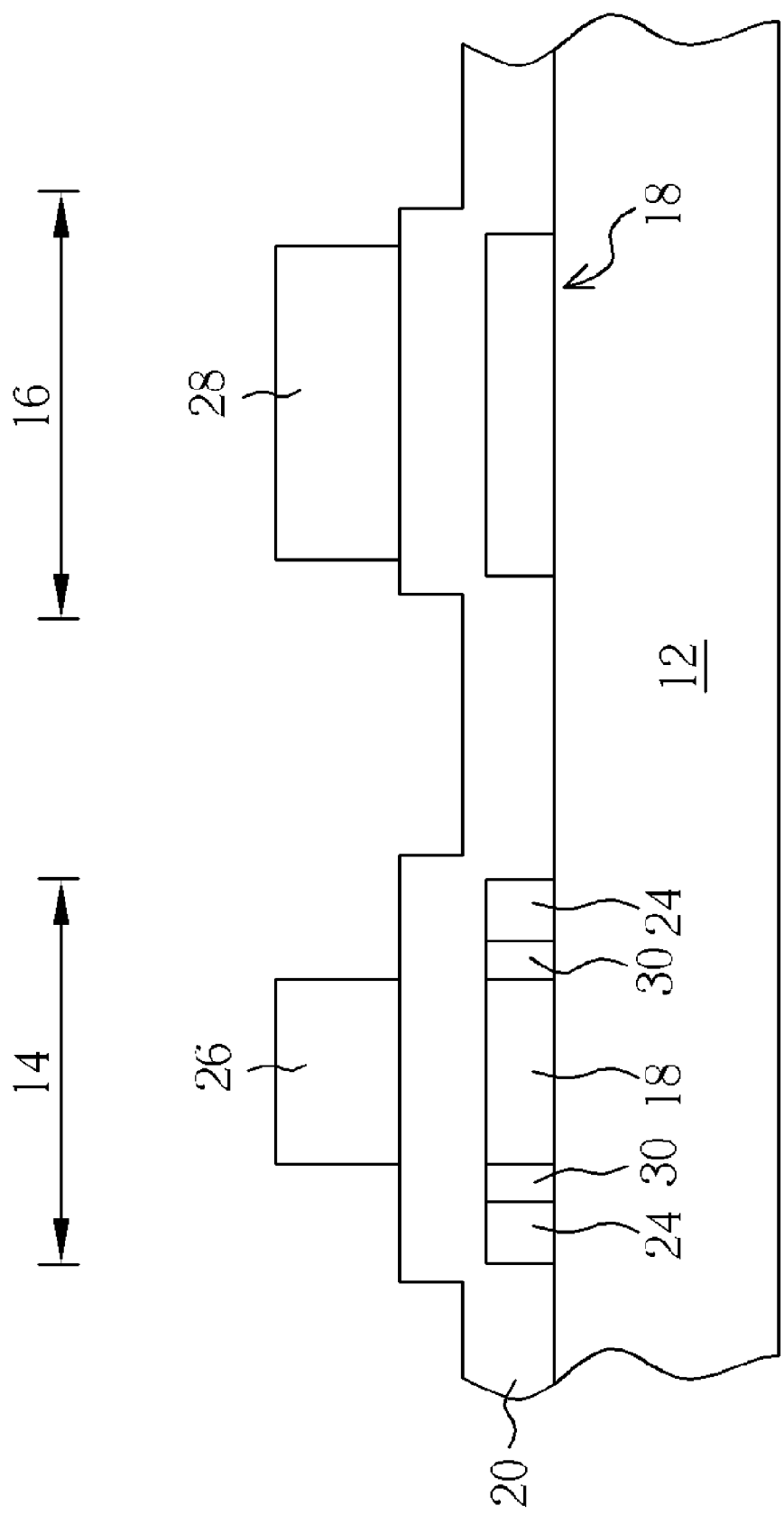
Figure 4:
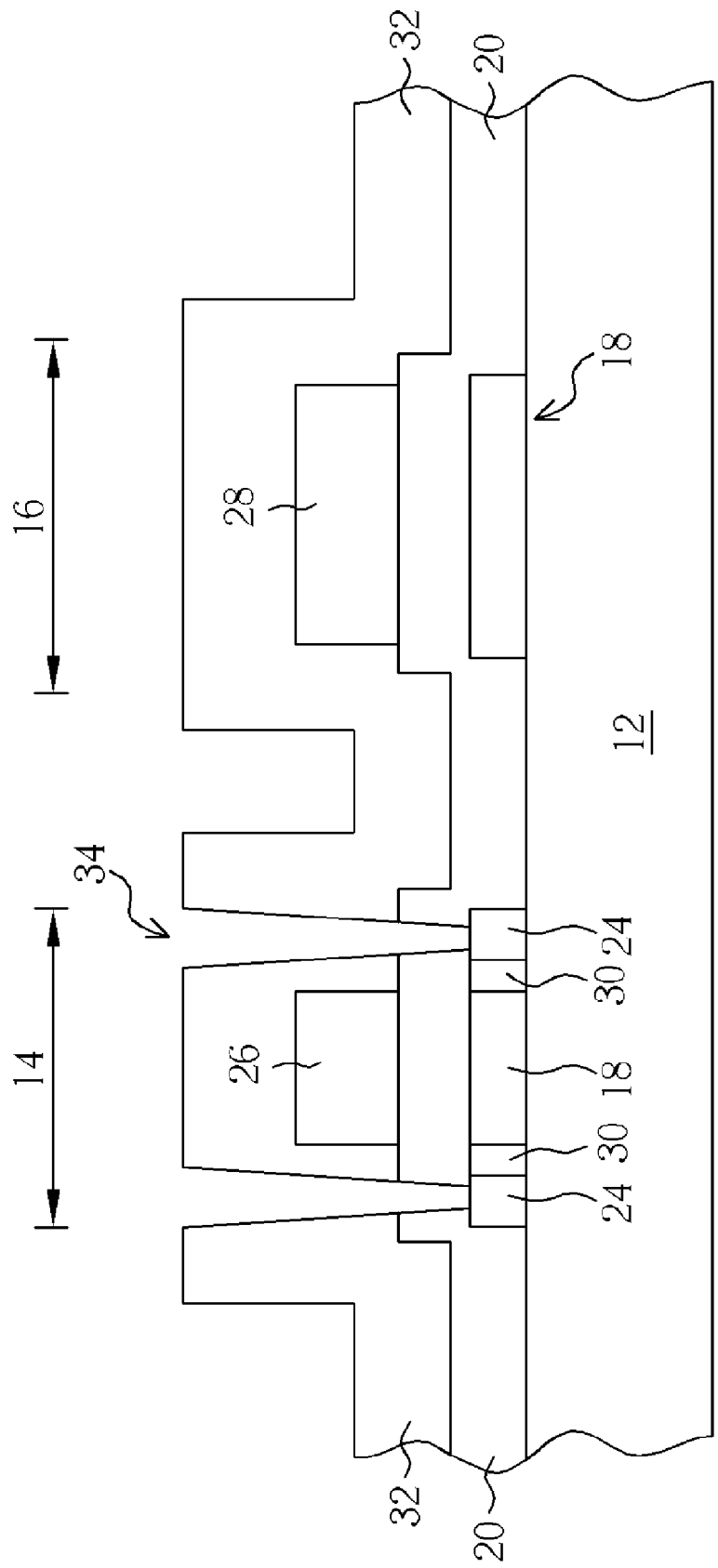
Figure 5:
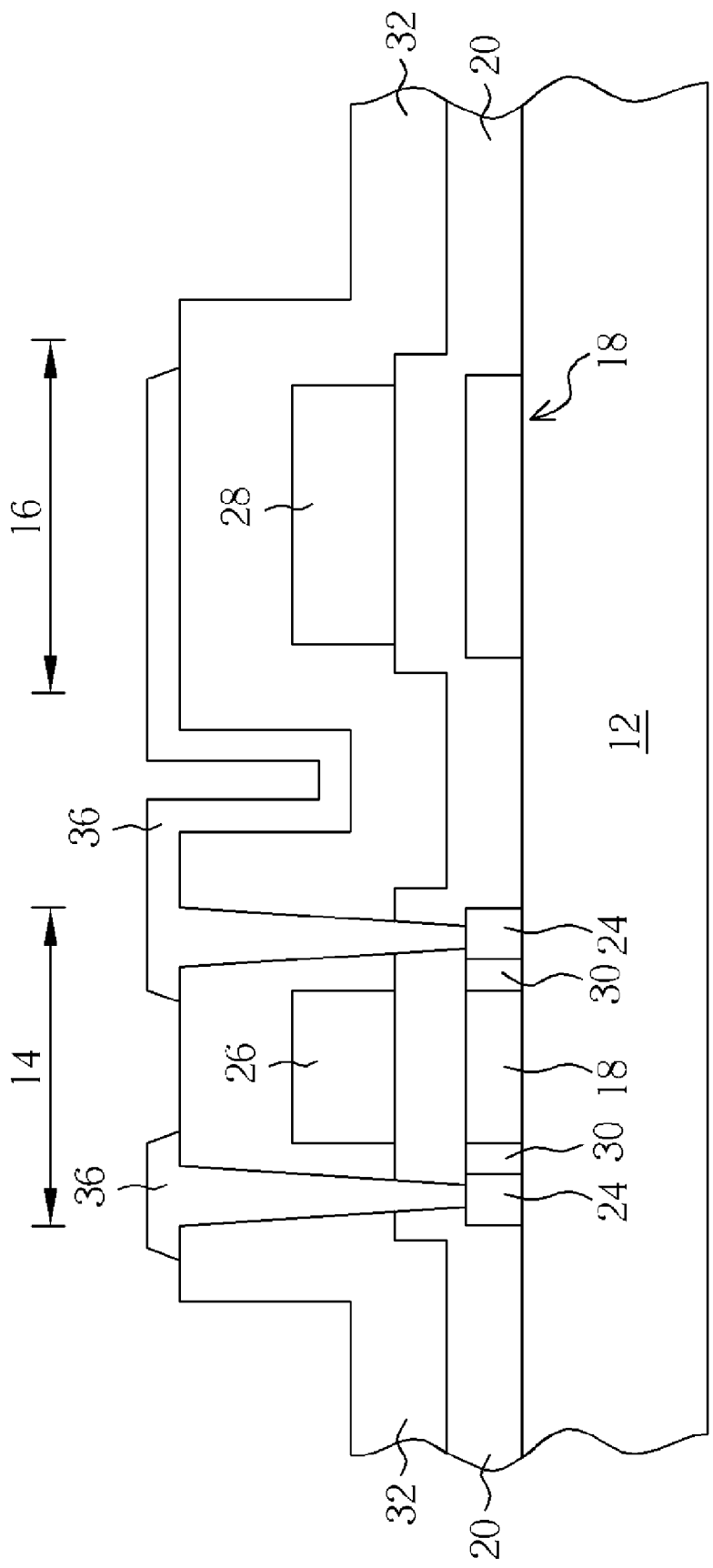
Figure 6:
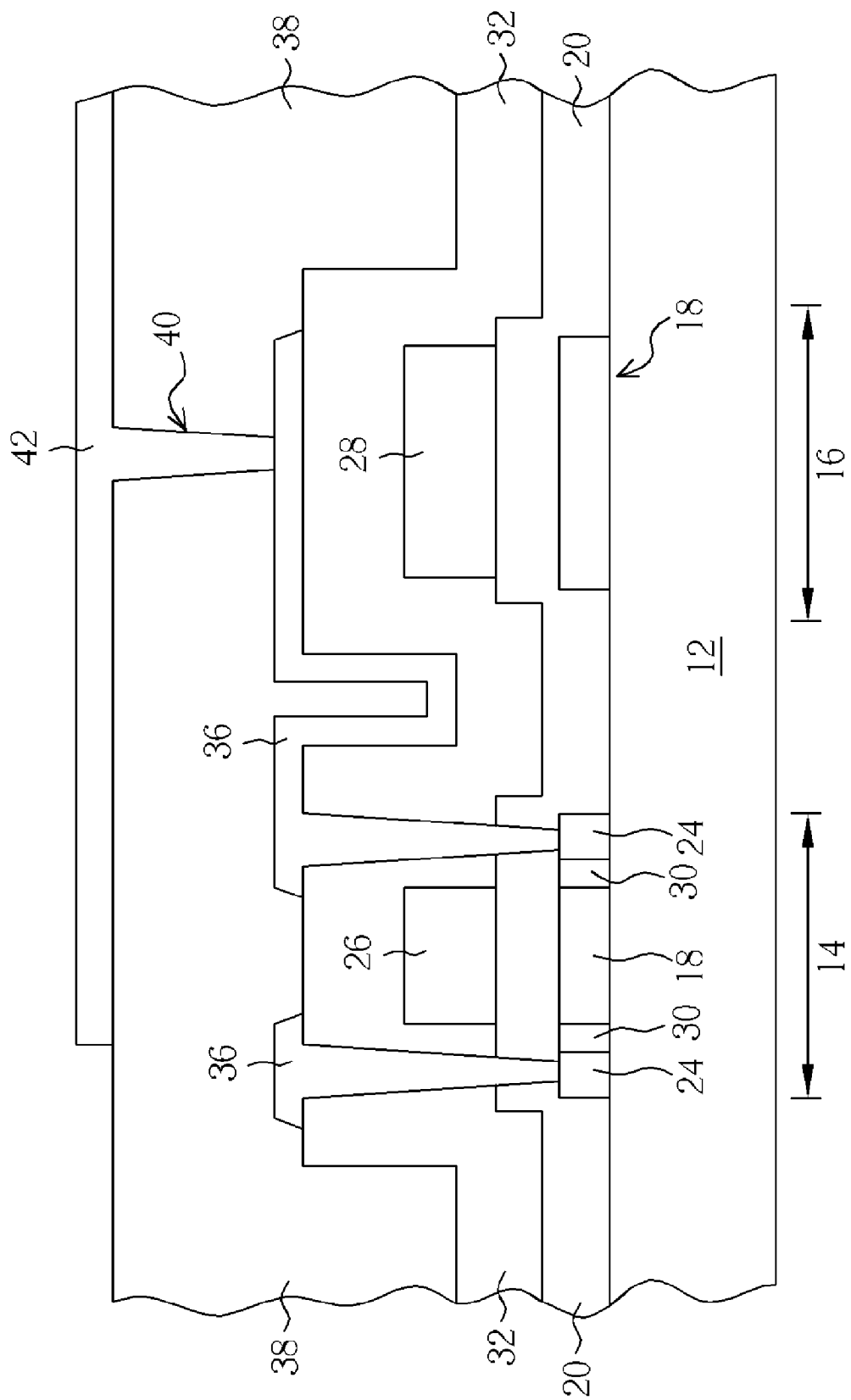
Figure 7:
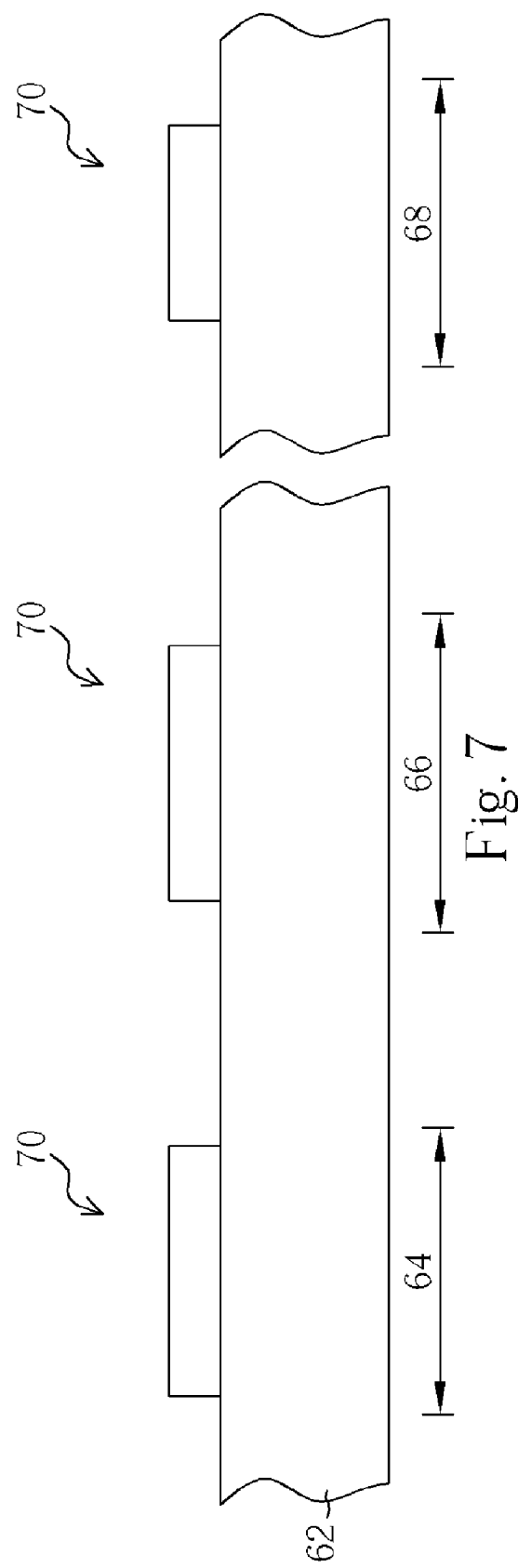
FIGS. 7-15 illustrate a method for fabricating a pixel structure according to a preferred embodiment of the present invention.

Referring to FIGS. 7-15, FIGS. 7-15 illustrate a method for fabricating a pixel structure according to a preferred embodiment of the present invention. As shown in FIG. 7, a substrate 62 is first provided. The substrate 62 can be a transparent glass substrate, in which the substrate 62 includes at least a transistor region 64, a capacitor region 66, and a pad region 68. A patterned semiconductor layer 70 is then formed on the transistor region 64, the capacitor region 66, and the pad region 68 of the substrate 62. The patterned semiconductor layer 70 disposed in the transistor region 64 is utilized to form a source/drain region of the transistor in the later process, and the patterned semiconductor layer 70 disposed in the capacitor region 66 is used to form a bottom capacitor electrode. The formation of the patterned semiconductor layer 70 can accomplished through a standard process for fabricating low temperature polysilicon semiconductors. For instance, an amorphous silicon layer (not shown) can be formed on the surface of the substrate 62, and an excimer laser annealing process is conducted thereafter to transform the amorphous silicon layer into a polysilicon layer. A patterning process is then performed to remove a portion of the polysilicon layer to form the aforementioned patterned semiconductor layer 70.

Figure 8:
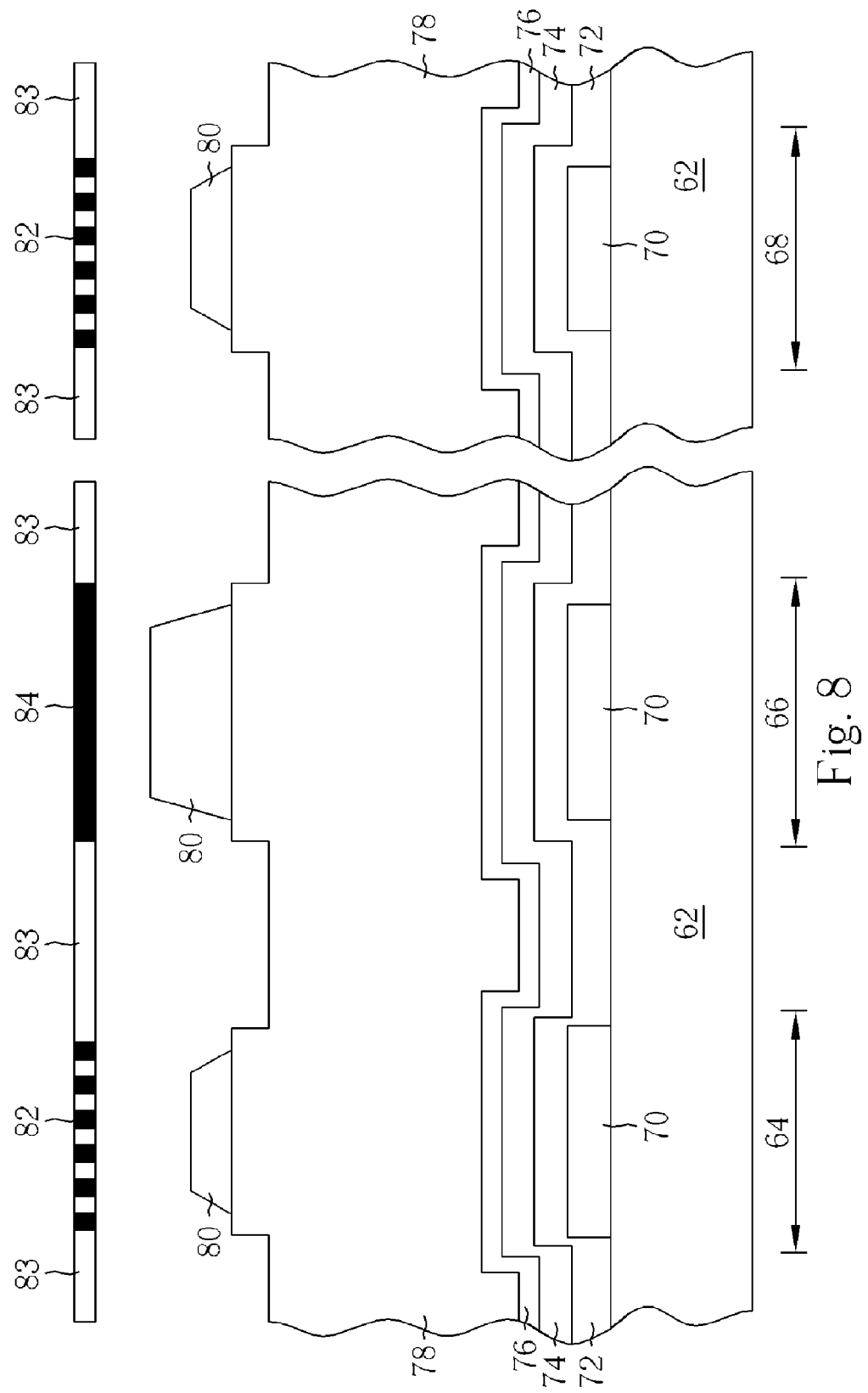

As shown in FIG. 8, a gate dielectric layer 72 composed of silicon oxide is deposited on the patterned semiconductor layer 70, and a conductive layer 74, a dielectric layer 76, and an electrode layer 78 are formed on the gate dielectric layer 72 thereafter. The conductive layer 74 is composed of a material which is resistant to wet etching processes, such as molybdenum. The thickness of the conductive layer 74 is approximately 2000 angstroms. The dielectric layer 76 is composed of silicon oxide having a thickness of approximately 500 angstroms. The electrode layer 78 is composed of a material suitable for isotropic etching process. Preferably, the electrode layer 78 is composed of aluminum having a thickness between 4000 angstroms to 10000 angstroms.

Next, a patterned photoresist layer 80 is formed on the electrode layer 78 of the transistor region 64 and the capacitor region 66. According to the preferred embodiment of the present invention, the process of forming the photoresist layer 80 on each region of the substrate includes following steps. First, a photoresist layer (not shown) is formed over the surface of the electrode layer 78, and a photolithography process is conducted by disposing a half-tone mask on the photoresist layer. The half-tone mask preferably includes a half-tone mask region 82, a fully transparent mask region 83, and a fully blocked mask region 84. Specifically, the half-tone mask region 82 covers a portion of the transistor region 64 and the pad region 68, and the fully blocked mask region 84 covers a portion of the capacitor region 66. An exposure and development process is then conducted to transfer the pattern of the half-tone mask region 82 and the fully blocked mask region 84 to the photoresist layer, thereby forming the patterned photoresist layer 80 disposed on the transistor region 64, the capacitor region 66, and the pad region 68.

Figure 9:
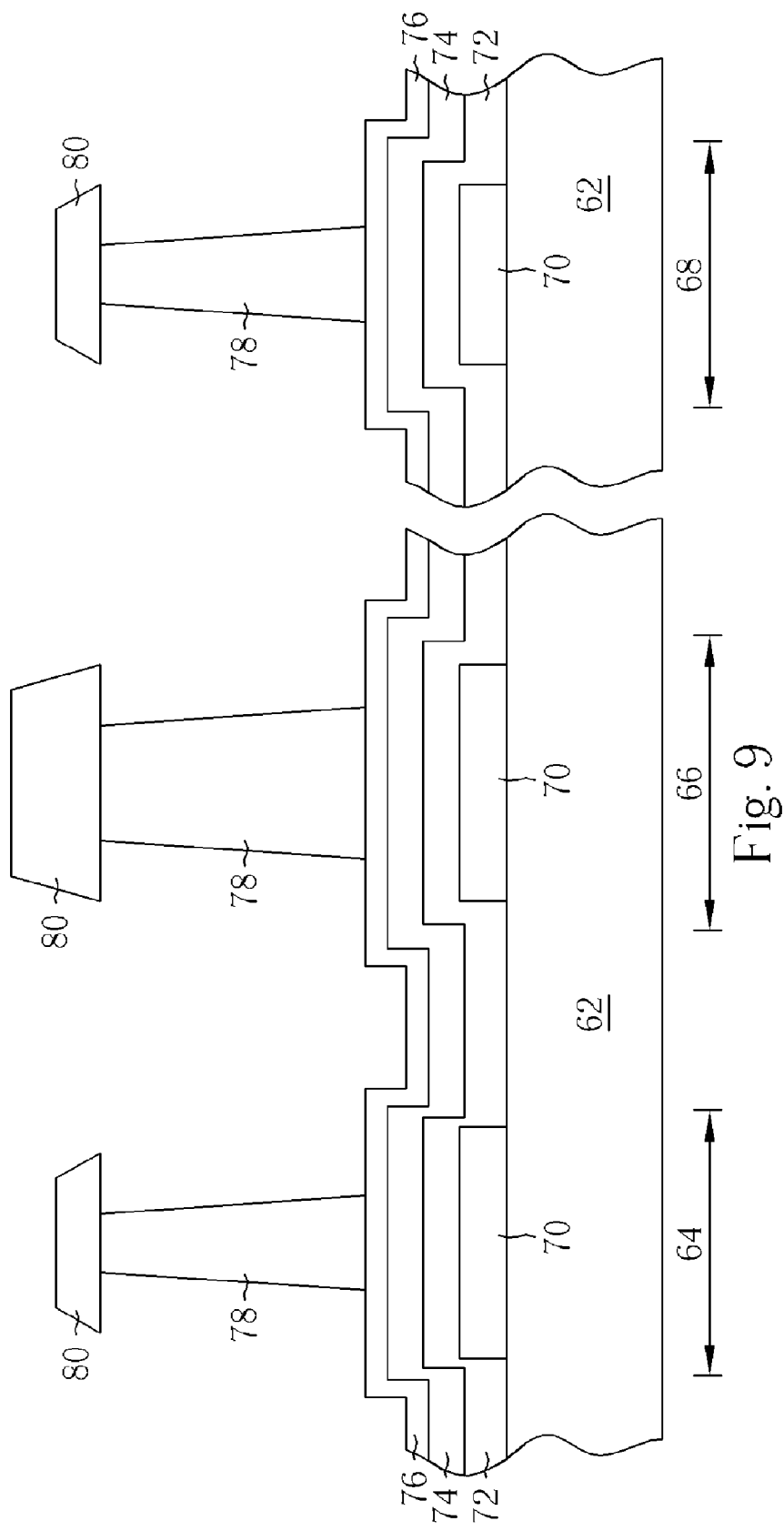

As shown in FIG. 9, an etchant is utilized to performed an isotropic wet etching process, in which the patterned photoresist layer 80 are utilized as mask to even remove a portion of the electrode layer 78 in both horizontal and vertical direction. The etchant is preferably a mixture containing phosphoric acid, acetic acid, and nitric acid.

Figure 10:
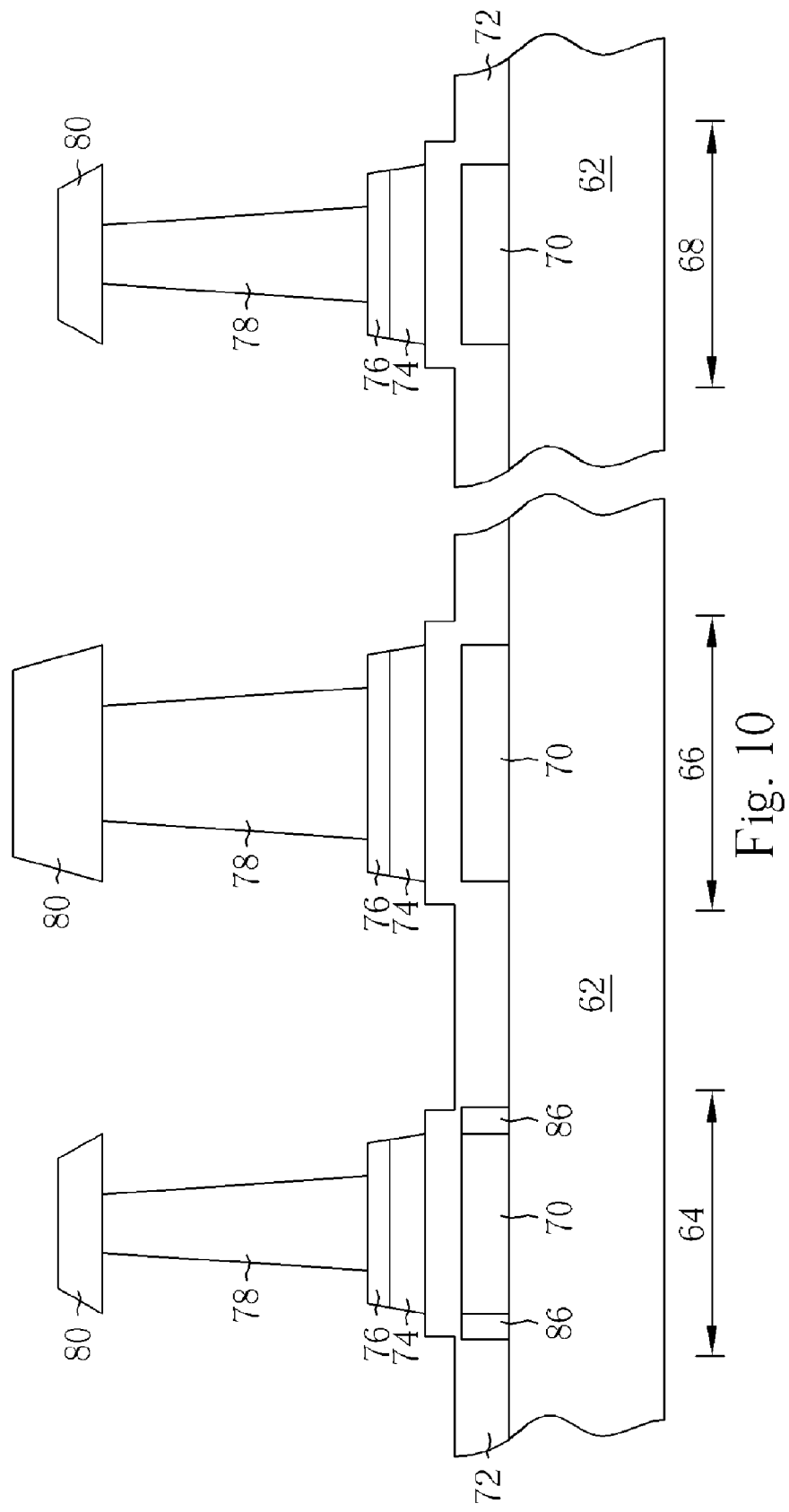

Next, as shown in FIG. 10, a first etching process is performed by using the patterned photoresist layer 80 as mask to remove a portion of the dielectric layer 76 and the conductive layer 74. A first ion implantation process is conducted thereafter to inject p-type or n-type dopants into the patterned semiconductor layer 70 of the transistor region 70 and form a source/drain region 86.

Figure 11:
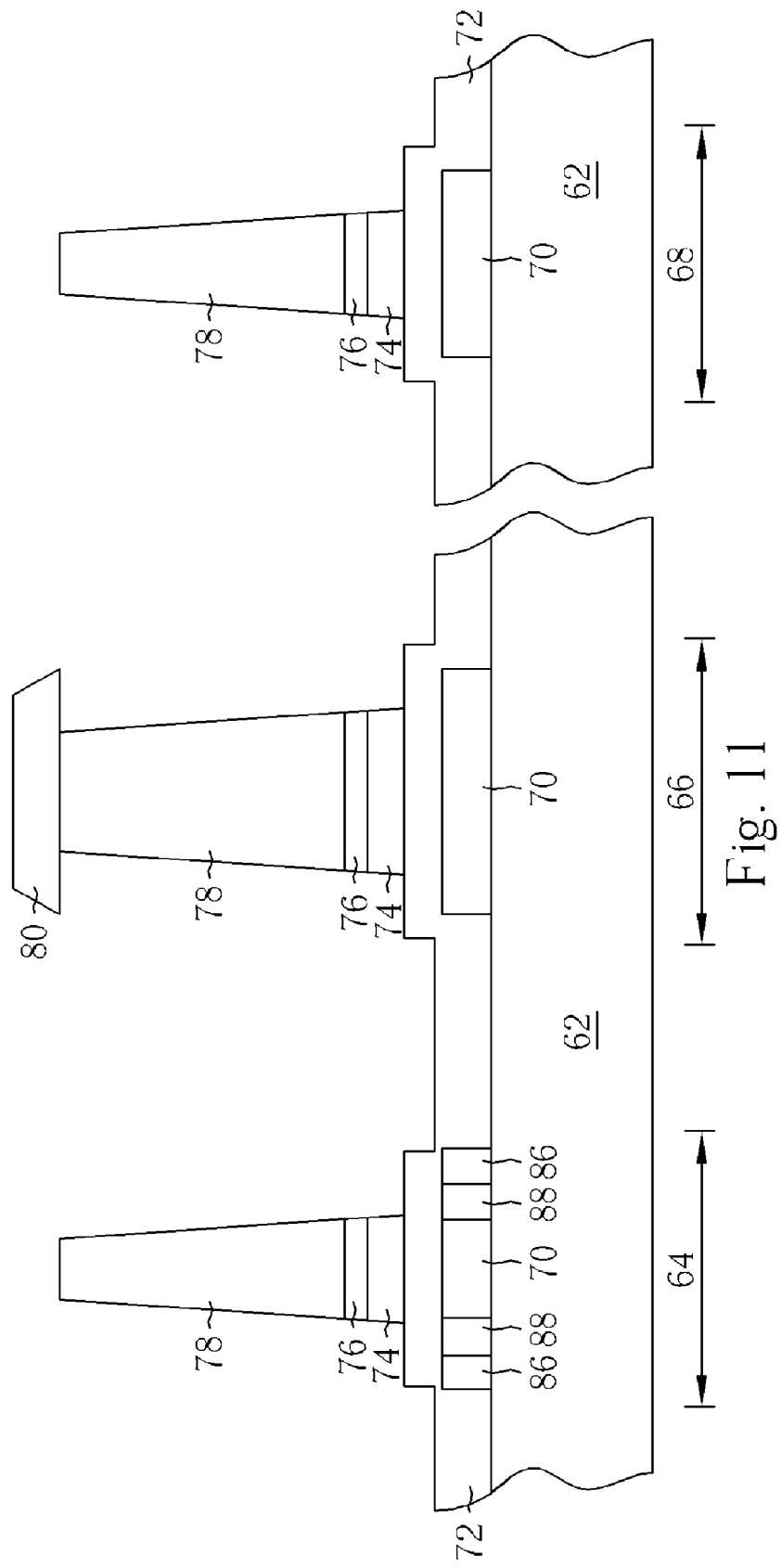

As shown in FIG. 11, the patterned photoresist layer 80 disposed on the transistor region 64 and the pad region 68 are removed, and a second etching process is conducted by using the electrode layer 78 of the transistor region 64 and the pad region 68 as mask to remove a portion of the dielectric layer 76 and the conductive layer 74 disposed in the transistor region 64 and the pad region 68. Thereafter, a second ion implantation is performed by using the remaining dielectric layer 76 and the conductive layer 74 of the transistor region 64, the patterned photoresist layer 80 of the capacitor region 66, and the remaining electrode layer 78, the dielectric layer 76, and the conductive layer 74 of the pad region 68 as mask to form a lightly doped drain 88 in the patterned semiconductor layer 70 of the transistor region 64.

Figure 12:
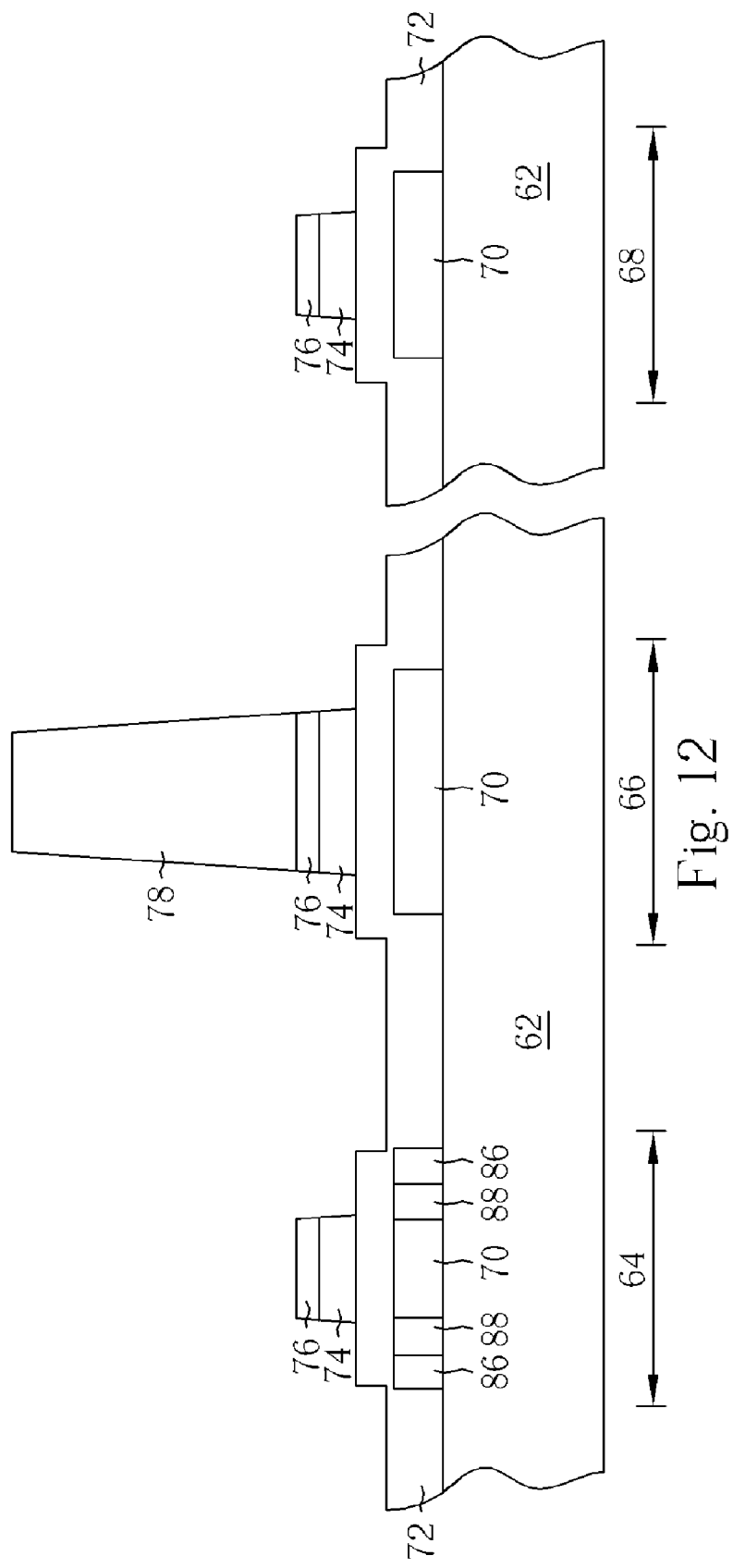

As shown in FIG. 12, a third etching process is performed by using the patterned photoresist layer 80 of the capacitor region 66 as a mask to remove the electrode layer 78 disposed in the transistor region 64 and the pad region 68. The patterned photoresist layer 80 of the capacitor region 66 is removed thereafter. The results obtain a transistor in the transistor region 64, a capacitor in the capacitor region 66, and a pad in the pad region 68.

It should be noted that the etchant used for etching the electrode layer 78 has the characteristic of achieving an isotropic etching process. Hence, when the etchant is used to etch the electrode layer 78 having a thickness between 4000 angstroms and 10000 angstroms, not only the bottom of the electrode 78 is removed but also the sidewall of the electrode layer 78 is removed for a length required for forming the lightly doped drain (about 0.7 microns). In other words, by adjusting the etching process performed to etch the electrode layer 78, the length of the lightly doped drain formed thereafter can be controlled accordingly. According to the preferred embodiment of the present invention, the present invention not only reduces the number of masks utilized before the formation of the source/drain region from three to two, but also forms a stacked structure composed of silicon oxide and aluminum on the electrode of the capacitor for increasing the storage capacitance of the capacitor.

Figure 13:
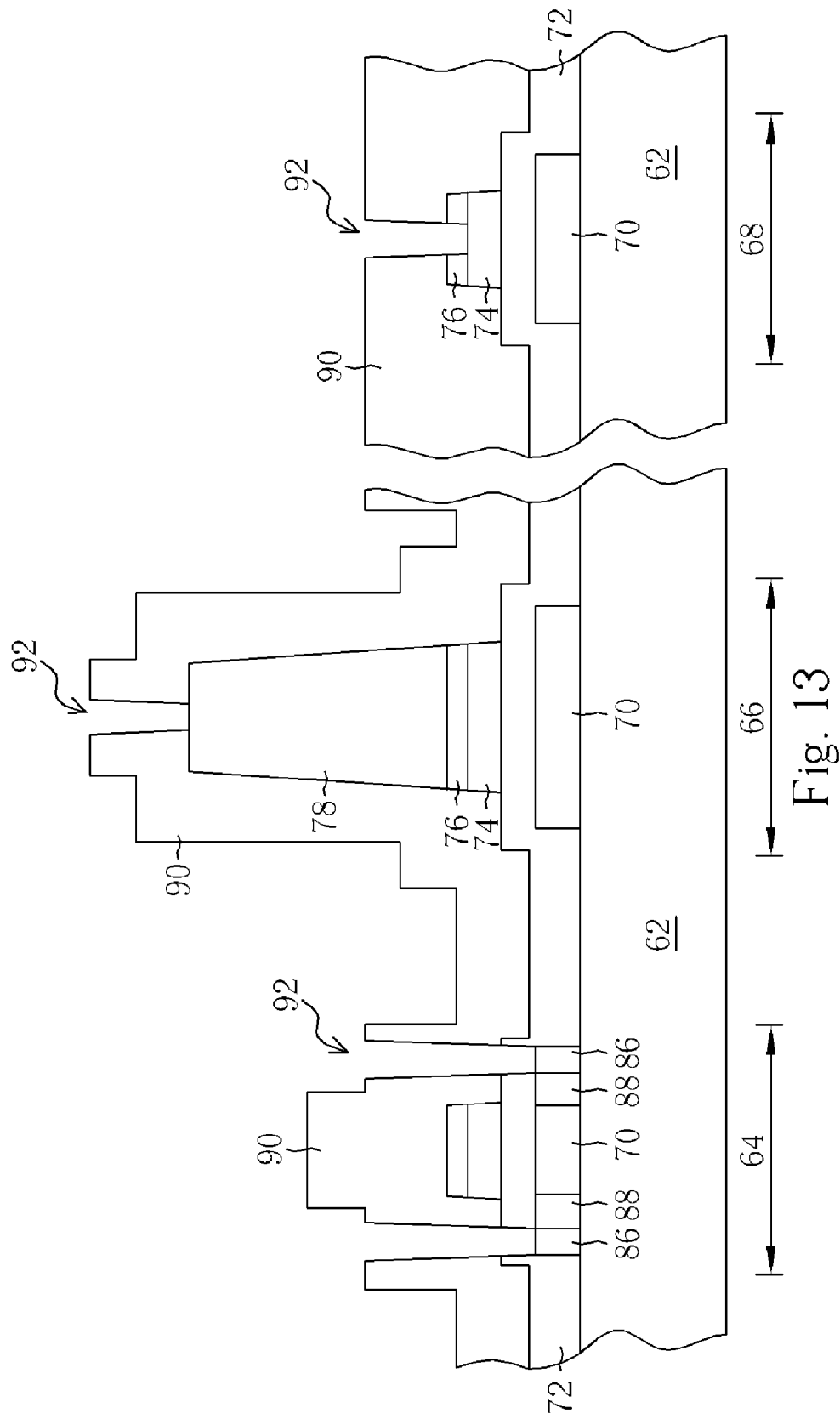

As shown in FIG. 13, a first dielectric layer 90 is formed on the substrate 62, and a patterning process is performed thereafter. For instance, a patterned photoresist layer (not shown) is utilized as mask to conduct an etching process to form a plurality of first via holes 92 in the first dielectric layer 90. Preferably, the first via holes 92 expose the source/drain region 86 of the transistor region 64, the electrode layer 78 of the capacitor region 66, and the conductive layer 74 of the pad region 68.

Figure 14:
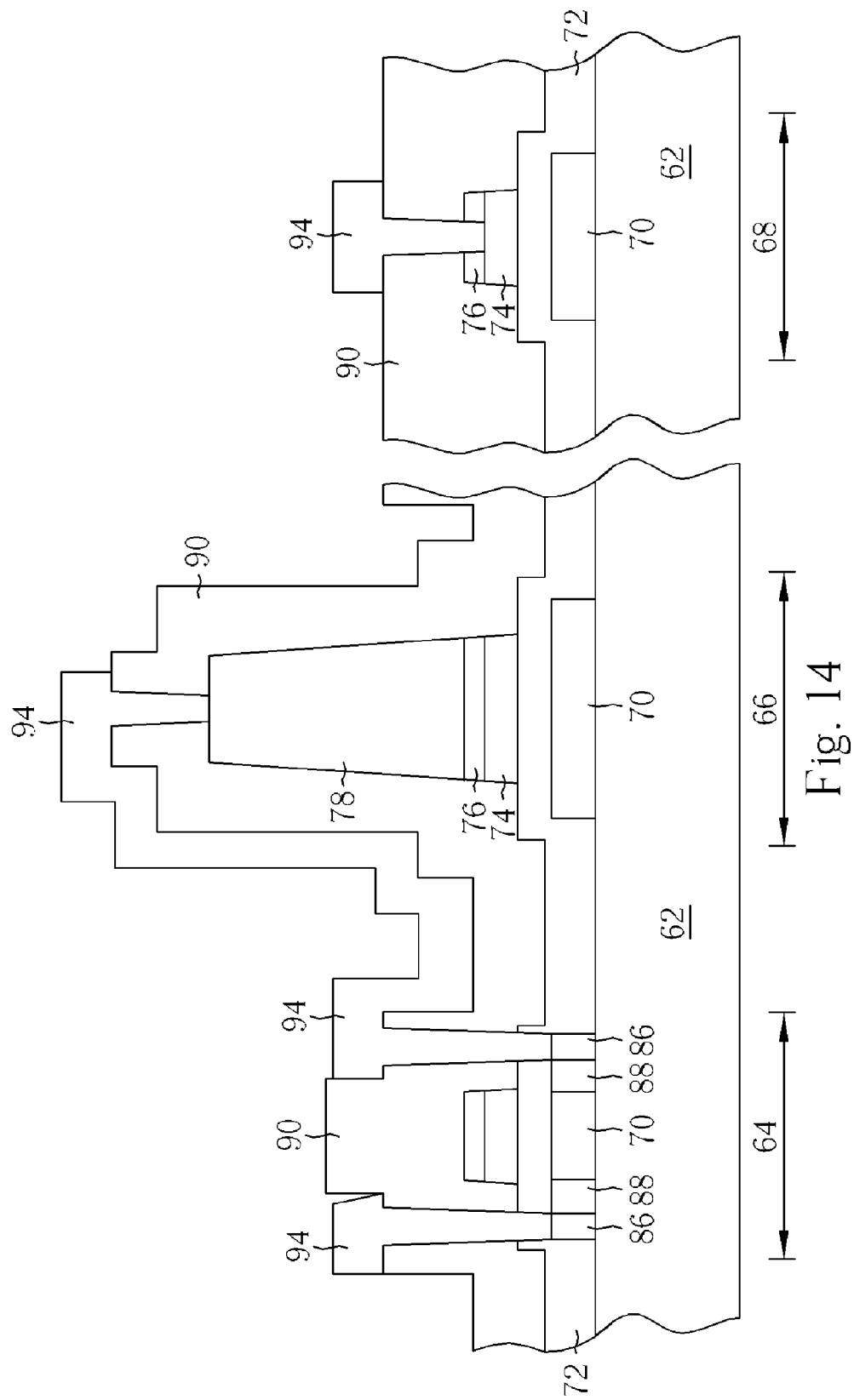

Next, as shown in FIG. 14, a patterned metal layer is formed on the dielectric layer 90 and into each of the via holes 90 to form a plurality of wires 94.

Figure 15:
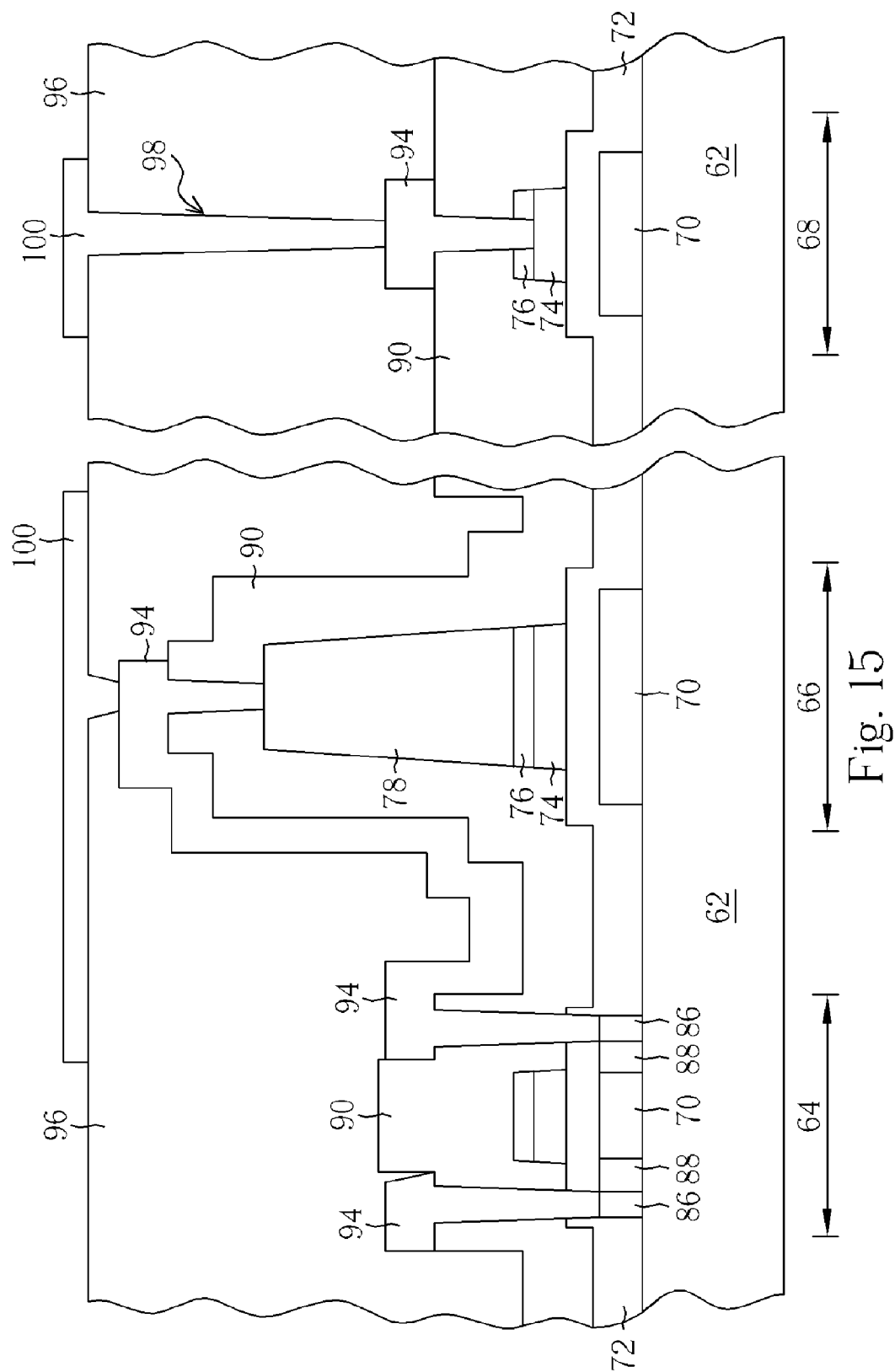

As shown in FIG. 15, a second dielectric layer 96 serving as a planarizing layer is formed on the wires 94, and a patterning process is performed to form a plurality of openings 98 in the second dielectric layer 96. A patterned transparent conductive layer composed of indium tin oxide or indium zinc oxide is formed on the second dielectric layer 96 and into the openings 98 to form corresponding pixel electrodes 100. This completes the fabrication of a pixel structure according to the preferred embodiment of the present invention.

Referring to FIG. 15, a pixel structure formed on the substrate 62 having a transistor region 64 and a capacitor region 66 is disclosed. Preferably, the pixel structure includes: a patterned semiconductor layer 70 disposed on the transistor region 64, in which the patterned semiconductor layer 70 has a channel region and a source/drain region surrounding the channel region; a first capacitor electrode (such as the patterned semiconductor layer 70 disposed in the capacitor region 66); a gate dielectric layer 70 disposed on the patterned semiconductor layer 70 of the transistor region 64 and the capacitor region 66; a gate (such as the conductive layer 74 disposed in the transistor region 64) disposed on the channel region of the patterned semiconductor layer 70; a second capacitor electrode (such as the conductive layer 74 disposed in the capacitor region 66); a dielectric layer 76 and an electrode layer 78 composed of aluminum disposed on the gate dielectric layer 72 of the capacitor region 66; a dielectric layer 90 disposed on the gate and the electrode layer 78; at least one wire 94 formed in the dielectric layer 90 and electrically connected to the source/drain region 86 of the semiconductor layer 70 and the electrode layer 78; a dielectric layer 96 disposed on the wire 94; and a pixel electrode 100 disposed on the dielectric layer 96 and connected to the wire 94.

Overall, the present invention discloses a method for fabricating pixel structures. Specifically, a conductive layer composed of molybdenum, a dielectric layer composed of silicon oxide and an aluminum layer are deposited on a gate dielectric layer, and an isotropic etching process is performed to evenly remove a portion of the aluminum layer in both horizontal and vertical direction. Typically, the etchant utilized to etch aluminum material has the characteristic of achieving an isotropic etching process. Hence, when the aluminum layer is etched, not only the bottom portion of the aluminum layer is removed, the sidewall of the aluminum layer is removed simultaneously to expose a required length for the lightly doped drain formed afterwards. In other words, the present invention could reduce the number of masks required to form the source/drain region from three to two, thereby reducing the overall cost of the fabrication process. According to an embodiment of the present invention, a stacked structure composed of silicon oxide and aluminum can also be formed on the capacitor electrode (such as the conductive layer composed of molybdenum) to increase the storage capacitance of the capacitor.

Those skilled in the art will readily observe that numerous modifications and alterations of the device and method may be made while retaining the teachings of the invention.

What is claimed is:

1. A method of fabricating a pixel structure, comprising:
   providing a substrate having a transistor region and a capacitor region;
   forming a patterned semiconductor layer on the transistor region and the capacitor region of the substrate;
   forming a gate dielectric layer on the patterned semiconductor layer;
   forming a conductive layer, a dielectric layer, and an electrode layer sequentially on the substrate;
   forming a patterned photoresist layer on the electrode layer of the transistor region and the capacitor region;
   performing an isotropic etching process by using the patterned photoresist layer as mask to remove a portion of the electrode layer in both vertical and horizontal direction;
   performing a first etching process by using the patterned photoresist layer as a mask to remove a portion of the dielectric layer and the conductive layer;
   performing a first ion implantation process by using the patterned photoresist layer as mask to form a source/drain region in the patterned semiconductor layer;
   removing the patterned photoresist layer of the transistor region;
   performing a second etching process by using the electrode layer as mask to remove a portion of the dielectric layer and the conductive layer;
   performing a second ion implantation process by using the patterned photoresist layer as mask to form a lightly doped drain region in the patterned semiconductor layer;
   performing a third etching process by using the patterned photoresist layer of the capacitor region as mask to remove the electrode layer disposed in the transistor region;
   removing the patterned photoresist layer disposed in the capacitor region;
   forming a first dielectric layer on the substrate and forming a plurality of first via holes in the first dielectric layer;
   forming a patterned metal layer on the first dielectric layer and into the first via holes for forming a plurality of first wires;
   forming a second dielectric layer on the first wires including a first opening in the second dielectric layer; and
   forming a patterned transparent conductive layer on the second dielectric layer and into the first opening for forming a pixel electrode.

2. The method of claim 1, wherein the step of forming the patterned semiconductor layer comprises:
   forming an amorphous silicon layer on the substrate;
   performing an excimer laser annealing process to transform the amorphous silicon layer into a polysilicon layer; and performing a patterning process to remove a portion of the polysilicon layer for forming the patterned semiconductor layer.

3. The method of claim 1, wherein a material of the conductive layer comprises molybdenum.

4. The method of claim 1, wherein a material of the electrode layer comprises aluminum.

5. The method of claim 1, wherein the thickness of the electrode layer is between 4000 angstroms and 10000 angstroms.

6. The method of claim 1 further comprising forming a half-tone mask in the transistor region before forming the plurality of patterned photoresist layer, wherein the half-tone mask corresponds to the patterned photoresist layer disposed in the transistor region.

7. The method of claim 1, wherein a material of the transparent conductive layer comprises indium tin oxide or indium zinc oxide.

8. A method of fabricating a pixel structure, comprising:
   providing a substrate having at least a transistor region, a capacitor region, and a pad region;
   forming a patterned semiconductor layer on the transistor region, the capacitor region, and the pad region of the substrate;
   forming a gate dielectric layer on the patterned semiconductor layer;
   forming a conductive layer, a dielectric layer, and an aluminum layer sequentially on the substrate;
   forming a patterned photoresist layer on the aluminum layer of the transistor region and the capacitor region;
   performing an isotropic etching process by using the patterned photoresist layer as mask to remove a portion of the aluminum layer in both vertical and horizontal direction;
   performing a first etching process by using the patterned photoresist layer as mask to remove a portion of the dielectric layer and the conductive layer;
   performing a first ion implantation process by using the patterned photoresist layer as mask to form a source/drain region in the patterned semiconductor layer;
   removing the patterned photoresist layer disposed in the transistor region and the pad region;
   performing a second etching process by using the aluminum layer as mask to remove a portion of the dielectric layer and the conductive layer;
   performing a third etching process by using the photoresist layer of the capacitor region as mask to remove the aluminum layer disposed in the transistor region and the pad region;
   removing the patterned photoresist layer disposed in the capacitor region;
   forming a first dielectric layer on the substrate and forming a plurality of first via holes in the first dielectric layer;
   forming a patterned metal layer on the first dielectric layer and into the first via holes for forming a plurality of first wires;
   forming a second dielectric layer on the first wires including a first opening in the second dielectric layer; and
   forming a patterned transparent conductive layer on the second dielectric layer and into the first opening for forming a pixel electrode.

9. The method of claim 8, wherein the step of forming the patterned semiconductor layer comprises:
   forming an amorphous silicon layer on the substrate;
   performing an excimer laser annealing process to transform the amorphous silicon layer into a polysilicon layer; and
   performing a patterning process to remove a portion of the polysilicon layer for forming the patterned semiconductor layer.

10. The method of claim 8, wherein a material of the conductive layer comprises molybdenum.

11. The method of claim 8, wherein a material of the dielectric layer comprises silicon oxide.

12. The method of claim 8, wherein the thickness of the aluminum layer is between 4000 angstroms and 10000 angstroms.

13. The method of claim 8 further comprising forming a half-tone mask in the transistor region and the pad region before forming the plurality of patterned photoresist layer, wherein the half-tone mask corresponds to the patterned photoresist layer disposed in the transistor region and the pad region.

14. The method of claim 8, wherein a material of the patterned transparent conductive layer comprises indium tin oxide or indium zinc oxide.

15. The method of claim 8 further comprising performing a second ion implantation process after the second etching process, wherein the second ion implantation process utilizes the aluminum layer as mask to form a lightly doped drain in the patterned semiconductor layer of the transistor region.

* * * * *